United States Patent
Cheng

[11] Patent Number: 5,834,344
[45] Date of Patent: Nov. 10, 1998

[54] METHOD FOR FORMING HIGH PERFORMANCE THIN FILM TRANSISTOR STRUCTURE

[75] Inventor: Jia-Shyong Cheng, Hsi-Chu, Taiwan

[73] Assignee: Industrial Technology Research Institute, Hsinchu, Taiwan

[21] Appl. No.: 680,687

[22] Filed: Jul. 17, 1996

[51] Int. Cl.$^6$ .................................................. H01L 29/04
[52] U.S. Cl. ............................................. 438/158; 257/59
[58] Field of Search .................... 257/57, 59, 61, 257/66, 72, 435, 659, 749; 438/158

[56] References Cited

U.S. PATENT DOCUMENTS

| | | | |
|---|---|---|---|
| 5,229,644 | 7/1993 | Wakai et al. | 257/749 |
| 5,371,398 | 12/1994 | Nishihara | 257/57 |
| 5,552,630 | 9/1996 | Miyake | 257/72 |

FOREIGN PATENT DOCUMENTS 60-236267  11/1985  Japan ........................................ 257/72

*Primary Examiner*—Mark V. Prenty
*Attorney, Agent, or Firm*—Tung & Associates

[57] ABSTRACT

A high performance thin film transistor structure which includes a pixel electrode layer formed after a passivation step such that electrical connections can be made to a source electrode and to overlap a channel length of the transistor. As a result, the effective channel length can be reduced and the occurrence of short-circuiting is also minimized in densely packed devices. The pixel electrode can be formed of a non-transparent metallic material to serve as a light shield such that the thin film transistor can be most suitably used in a liquid crystal display device.

7 Claims, 1 Drawing Sheet

METHOD FOR FORMING HIGH PERFORMANCE THIN FILM TRANSISTOR STRUCTURE

FIELD OF THE INVENTION

The present invention generally relates to a high performance thin film transistor of the inverted staggered type and more particularly, relates to a high performance inverted staggered thin film transistor that has a pixel electrode deposited after a passivation step for making electrical contact to a source region and method of manufacturing same.

BACKGROUND OF THE INVENTION

Thin film transistors (TFT) have been used widely in various electronic applications. A TFT is constructed by stacking a gate electrode, a semi-conducting layer, a source electrode, and a drain electrode on a non-conducting insulating substrate. The thin film transistors are frequently used as switching devices for liquid crystal display units. A more recently developed thin film transistor is an inverted staggered type which is formed by stacking a plurality of thin films successively in a vacuum chamber. The inverted staggered type TFT, due to its simplified structure and manufacturing process, has proven to be a more reliable device and can be mass produced with high yield rate.

A conventional inverted staggered type TFT 10 is shown in FIG. 1. A gate electrode 14 is first formed on a non-conducting substrate 12. The gate electrode 14 is connected by a gate line (not shown) laid out in the row direction. A dielectric material layer 16 of either a silicon oxide or a silicon nitride material is used to insulate the gate electrode 14. After an amorphous silicon layer 16 and a contact layer of doped amorphous silicon 20 are sequentially deposited, patterned and etched, source electrode 22 and drain electrode 24 are formed providing a channel 26 in between the two electrodes. The source electrode 22 of the thin film transistor is connected to a transparent pixel electrode 28 independently formed in the area surrounded by the gate lines and the drain lines (not shown). On top of the transistor structure 10, a passivation layer 30 of either silicon oxide or silicon nitride material is then deposited to complete the structure.

In the thin film transistor structure shown in FIG. 1, the channel length 26 is defined by the source and drain regions 22 and 24. Since part of the drain electrode 24, the drain line (not shown), and the pixel electrode 28 are formed on the same dielectric layer (the gate insulating layer) 16, both electrodes tend to be short-circuited. When short-circuiting occurs, the defect rate of the thin film transistor is greatly increased. The defect occurs more frequently in a TFT array wherein a series of TFTs are arranged in a matrix form with the pixel electrode 28 formed in a region surrounded by the gate lines and the drain lines (not shown), the occurrence of short-circuiting tends to increase between the pixel electrode 28 and the drain line (not shown). In order to prevent such short-circuiting, the pixel electrode 28 and the drain line should be spaced apart at a sufficient distance in the design of the thin film transistor. This affects the design efficiency of a densely packed TFT device. Furthermore, since the channel length 26 is defined by the source region 22 and the drain region 24, a short channel length 26 further increases the occurrence of short-circuiting.

It is therefore an object of the present invention to provide a high performance thin film transistor structure that does not have the drawbacks and shortcomings of the conventional thin film transistor structures.

It is another object of the present invention to provide a high performance thin film transistor structure that does not have a short channel length such that the occurrence of shortcircuiting can be reduced.

It is a further object of the present invention to provide a high performance thin film transistor structure wherein a pixel electrode is deposited after the deposition of a passivation layer.

It is another further object of the present invention to provide a high performance thin film transistor structure wherein a pixel electrode is deposited after a passivation layer which overlaps the channel length.

It is still another object of the present invention to provide a high performance thin film transistor structure that has reduced effective channel length.

It is yet another object of the present invention to provide a high performance thin film transistor structure wherein the effective channel length is reduced to increase the performance of the transistor.

It is still another further object of the present invention to provide a high performance thin film transistor wherein the pixel electrode is deposited of a metallic material that is not transparent.

It is yet another further object of the present invention to provide a high performance thin film transistor wherein the pixel electrode is deposited of a metallic material that also functions as a light shield.

It is yet another further object of the present invention to provide a method of fabricating a high performance thin film transistor that includes a pixel electrode deposition step conducted after a passivation step.

SUMMARY OF THE INVENTION

In accordance with the present invention, a high performance thin film transistor is provided which has a pixel electrode deposited on top of a passivation layer for making connection with a source electrode and a method of fabricating the same.

In the preferred embodiment a thin film transistor structure is provided which includes a nonconductive substrate, a gate electrode deposited on the nonconductive substrate, a first dielectric layer deposited on top of the gate electrode, a semi-conducting layer deposited on the first dielectric layer which substantially covers the gate electrode and its peripheral region, a contact layer which has improved conductivity than the semi-conducting layer deposited which substantially covers the shoulder regions of the semi-conducting layer and exposing a center region of the semi-conducting layer, a metal layer that overlaps the contact layer to expose the center region of the semi-conducting layer and forms a source region and a drain region, a second dielectric layer that is deposited over the entire transistor structure, a via formed in the second dielectric layer to expose the source region, and a conducting layer deposited on top of the second dielectric layer to substantially cover the source region and the center region while providing electrical connection to the source region through the via.

The present invention is also directed to a method of fabricating a thin film transistor structure including the steps of first providing a non-conducting substrate, then depositing a gate electrode on the substrate, then depositing a first dielectric layer on top of the gate electrode, depositing a semi-conducting layer on the first dielectric layer to substantially cover the gate electrode and its peripheral region, depositing a contact layer which has improved conductivity than the semi-conducting layer to substantially cover the shoulder regions of the semi-conducting layer and to expose a center region of the semi-conducting layer, depositing a metal layer to overlap the contact layer to expose the center region of the semi-conducting layer and to form a source region and a drain region, depositing a second dielectric layer over the entire transistor structure, forming a via in the second dielectric layer to expose the source region, and depositing a conducting layer on top of the second dielectric layer to substantially overlap the source region and the center region while providing electrical connection to the source region through the via.

BRIEF DESCRIPTION OF THE DRAWINGS

Other objects, features, and advantages of the present invention will become apparent upon consideration of the specification and the appended drawings, in which.

DETAILED DESCRIPTION OF THE PREFERRED AND ALTERNATE EMBODIMENTS

The present invention provides a high performance thin film transistor structure that has a pixel electrode layer deposited at the end of the fabrication process covering a passivation layer such that the pixel electrode contacts the source region and overlaps the channel region. The effective channel length can be reduced and the performance of the thin film transistor can be improved. When a non-transparent metallic material is used in the pixel electrode deposition, the pixel electrode formed also serves the function of a light shield. This is particularly useful when the thin film transistor is used in a liquid crystal display device.

Figure 1:
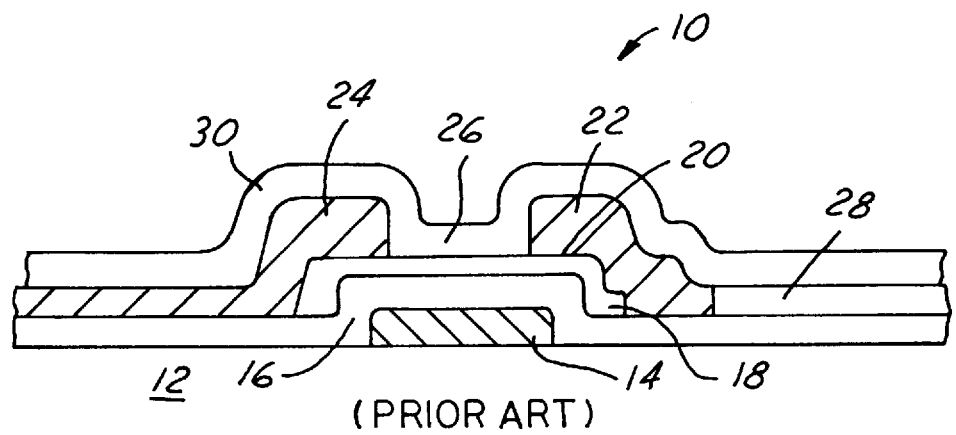
FIG. 1 is an enlarged cross-sectional view of a conventional thin film transistor of the inverted staggered type.
Figure 2:
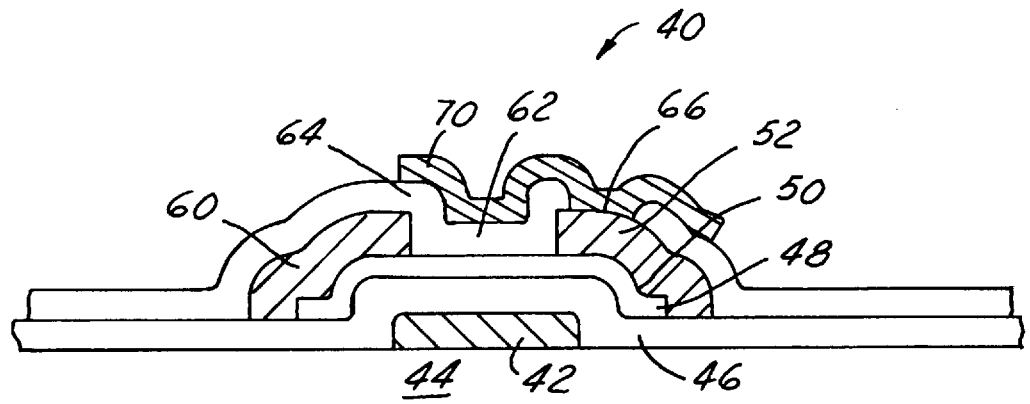
FIG. 2 is an enlarged cross-sectional view of the present invention high performance thin film transistor structure which has a pixel electrode layer deposited on top of a passivation layer.

Referring now to FIG. 2 wherein a preferred embodiment of the present invention high performance thin film transistor 40 is shown. In FIG. 2, a gate electrode 42 is first formed on a nonconducting substrate 44. The gate electrode 42 is connected by a gate line (not shown) laid out in the row direction. A dielectric layer 46 of either a silicon oxide or a silicon nitride material is used to insulate the gate electrode 42. After a semi-conducting layer 48 and a contact layer 50 are sequentially formed through a deposition step, a patterning step and an etching step, source electrode 52 and drain electrode 60 are formed providing a channel 62 in between the two electrodes. The semi-conducting layer 48 is frequently formed of an amorphous silicon material, while the contact layer 50 is frequently formed of a doped amorphous silicon layer which has improved conductivity. The source electrode 52 and the drain electrode 60 can be formed from any one of the suitable metals such as chromium, titanium, tungsten, tantalum, and aluminum.

In the next step of fabrication, a passivation layer 64 is deposited on the entire surface of the transistor 40 to provide isolation. A via 66 is formed through photolithography method to expose the source electrode 52. A pixel electrode layer 70 is then deposited on top of the passivation layer 64 and subsequently patterned to make electrical connection with the source electrode 66 and further, to substantially cover the channel length 62. The overlap of the pixel electrode layer 70 with the channel length 62 does not reduce the effective channel length requirement. The pixel electrode layer 70 can be deposited with various desirable materials such as transparent indium-tin-oxide (ITO) or any suitable metallic materials. A suitable thickness for layer 70 is between about 500 Å and about 30,000 Å. When a non-transparent metallic material is used for the deposition of the pixel electrode layer 70, the resulting pixel electrode layer 70 can also serve the desirable function of a light shield. This is particularly desirable when the resulting thin film transistor is used in a liquid crystal display device as the switching element.

The present invention high performance thin film transistor structure therefore provides greatly improved benefits over the conventional thin film transistor structures. Based on the overlapping between the pixel electrode and the channel length region, the occurrence of short-circuiting can be minimized. Furthermore, when a non-transparent metal is used in the deposition of the pixel electrode layer, the thin film transistor formed has a built-in light shield which is suitable for use in a liquid crystal display device.

Figure 3:
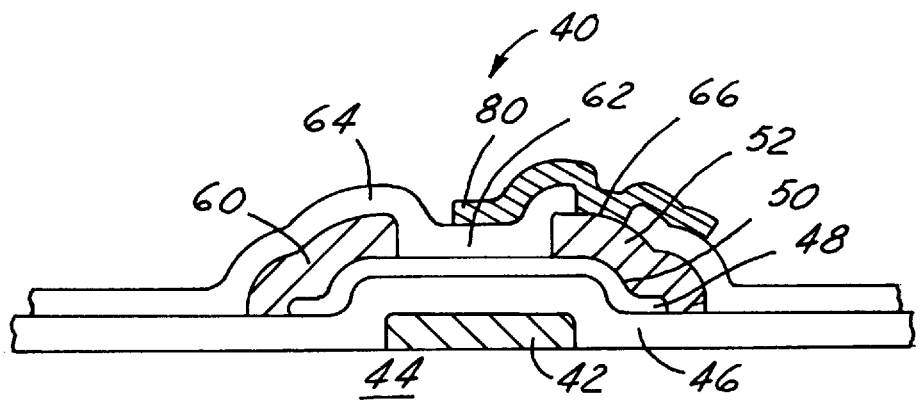
FIG. 3 is an enlarged cross-sectional view of the present invention high performance thin film transistor structure which has a pixel electrode layer deposited on top of a passivation layer without overlapping the drain electrode section.

In an alternate embodiment, as shown in FIG. 3, the pixel electrode layer 80 does not overlap the drain region 60. The partial overlap of the pixel electrode layer 80 with the channel length 62 reduces the effective channel length requirement. The layer 80 can also be deposited with various desirable materials such as transparent ITO or any suitable metallic materials. A suitable thickness range is between about 500 Å and about 30,000 Å. When a non-transparent metallic material is used for the deposition of layer 80, a partial black-matrix effect can be achieved to serve as a light shield.

While the present invention has been described in an illustrative manner, it should be understood that the terminology used is intended to be in a nature of words of description rather than of limitation.

Furthermore, while the present invention has been described in terms of a preferred and an alternate embodiment, it is to be appreciated that those skilled in the art will readily apply these teachings to other possible variations of the inventions.

The embodiment of the invention in which an exclusive property or privilege is claimed are defined as follows:

1. A method of fabricating a thin film transistor structure comprising the steps of:

providing a non-conductive substrate, depositing a gate electrode on said substrate, depositing a first dielectric layer on top of said gate electrode, depositing a semi-conducting layer on said first dielectric layer to substantially cover said gate electrode and its peripheral regions, depositing a contact layer having improved conductivity than said semi-conducting layer to substantially cover the shoulder regions of said semi-conducting layer and exposing a center region of said semi-conducting layer, depositing a metal layer overlapping said contact layer exposing the center region of said semi-conducting layer to form a source region and a drain region, depositing a second dielectric layer over the entire transistor structure, forming a via in said second dielectric layer exposing said source region, and depositing a conducting layer formed of a material selected from the group consisting of indium-tin-oxide, tin oxide and indium oxide on top of said second dielectric layer to substantially cover said source region, said center region and partially said drain region to provide electrical connection to said source region through said via.

2. A method of fabricating a thin film transistor structure according to claim 1, wherein said conducting layer is deposited on top of said second dielectric layer to cover said source region, said center region and partially said drain region and to provide electrical connection to said source region through said via.

3. A method of fabricating a thin film transistor structure according to claim 1, wherein said non-conductive substrate is made of a material selected from the group consisting of glass, quartz, sapphire, and other like ceramics.

4. A method of fabricating a thin film transistor structure according to claim 1, wherein said second dielectric layer is deposited of a material selected from the group consisting of silicon oxide, silicon nitride, polyimide and metal oxide.

5. A method of fabricating a thin film transistor structure according to claim 1, wherein the thickness of said second dielectric layer is between about 500 Å and about 30,000 Å.

6. A method of fabricating a thin film transistor structure according to claim 1, wherein said contact layer deposited is made of a material of doped amorphous silicon.

7. A method of fabricating a thin film transistor structure according to claim 1, wherein said metal layer deposited is formed of a material selected from the group consisting of chromium, titanium, tungsten, tantalum, and copper.

* * * * *